United States Patent

Hirai

[11] Patent Number: 5,815,530
[45] Date of Patent: Sep. 29, 1998

[54] DATA CONVERTERS FOR SOUND EQUIPMENT

[75] Inventor: Jun Hirai, Kyoto, Japan

[73] Assignee: Rohm Co., Ltd., Kyoto, Japan

[21] Appl. No.: 685,151

[22] Filed: Jul. 23, 1996

[30] Foreign Application Priority Data

Jul. 25, 1995 [JP] Japan ................................. 7-188741

[51] Int. Cl.⁶ ........................... H04B 14/06; H03M 3/00; H03M 1/12; H04J 3/16
[52] U.S. Cl. ........................ 375/247; 375/250; 375/252; 341/143; 341/155; 370/472
[58] Field of Search ................... 375/247, 250, 375/252; 341/143, 155, 76, 50; 370/472

[56] References Cited

U.S. PATENT DOCUMENTS

| 4,287,591 | 9/1981 | Strehl | 370/472 |
|---|---|---|---|
| 4,371,850 | 2/1983 | Klement | 375/247 |
| 4,803,461 | 2/1989 | Yamaguchi et al. | 341/154 |
| 4,851,841 | 7/1989 | Sooch | 341/143 |
| 5,208,595 | 5/1993 | Engel et al. | 341/143 |
| 5,323,156 | 6/1994 | Budmiger | 341/143 |
| 5,621,407 | 4/1997 | Jeong et al. | 341/143 |

FOREIGN PATENT DOCUMENTS

WO92/10037  6/1992  WIPO ................... 375/247

*Primary Examiner*—Chi H. Pham
*Assistant Examiner*—Khai Tran
*Attorney, Agent, or Firm*—Majestic, Parsons, Siebert & Hsue P.C.

[57] ABSTRACT

A delta modulation type data converter is adapted to carry out signal processing by sequentially comparing in cycles an inputted signal with a reference voltage set according to the results of previous comparisons and includes a plurality of current sources, switch circuits for setting a current value by appropriately selecting one or more of these current sources, an integrator circuit for generating the reference voltage according to a specified current value, and a control circuit for controlling the switch circuits to make an appropriate selection of these current sources according to the result of a comparison between the reference voltage and the inputted analog signal. The control circuit controls the switch circuits such that, if the result of comparison is the same as in the precious cycle, a selection from the current sources is made such that the current value will be increased, provided such selection is possible. If the result of comparison is inverted from the previous cycle, a selection is made such that the current direction with respect to the integrator circuit is reversed. If the result of comparison is inverted repeatedly for a specified plural number of cycles, a selection is made such that the current direction with respect to integrator circuit is reversed and the associated current value is reduced, provided such selection is possible. The plurality of current sources may include a first group connected to a source voltage and a second group connected to a reference voltage source, the current sources in each group having associated therewith current values which differ by a factor of 2 from one another.

4 Claims, 3 Drawing Sheets

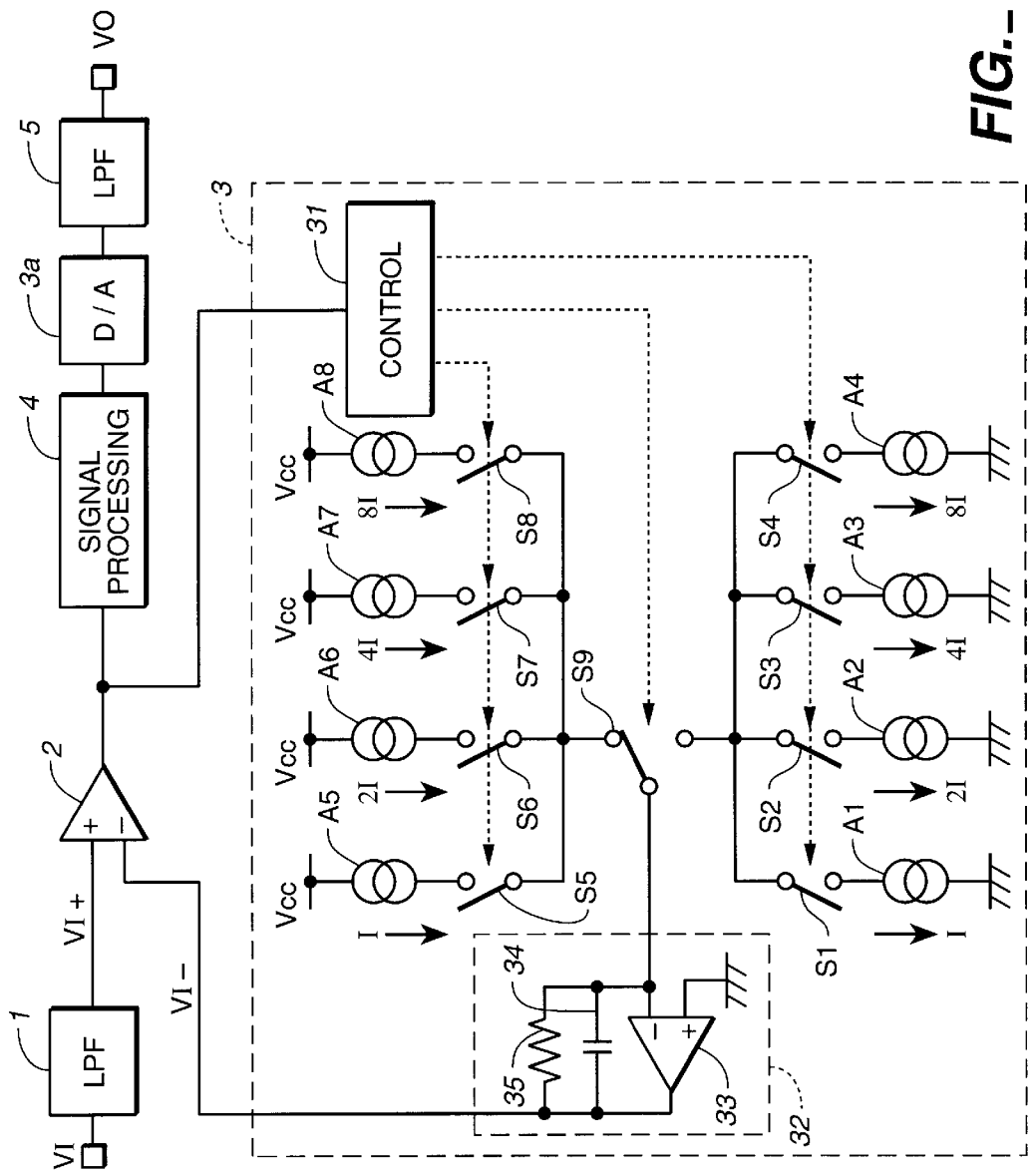
FIG._1

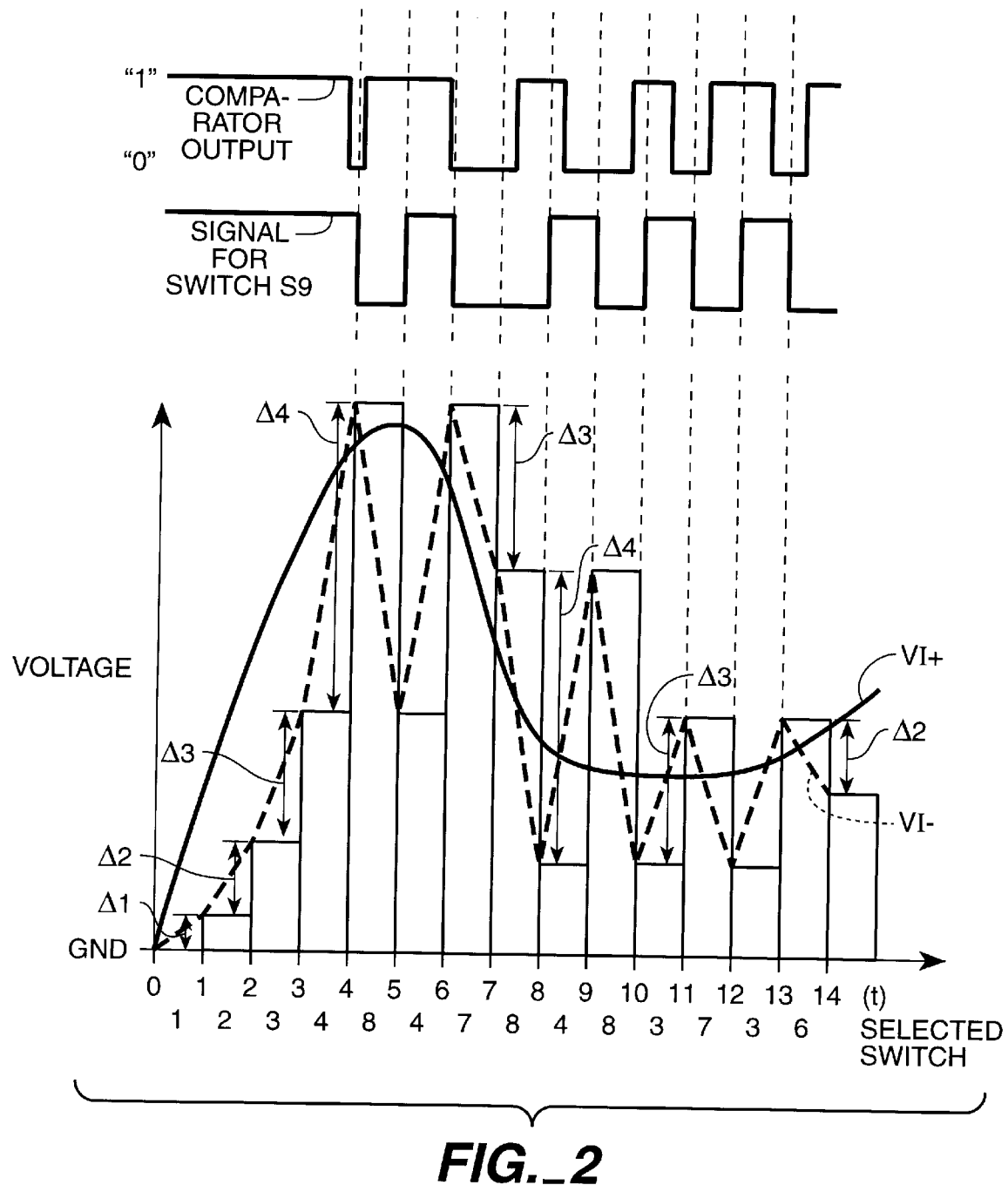
FIG._2

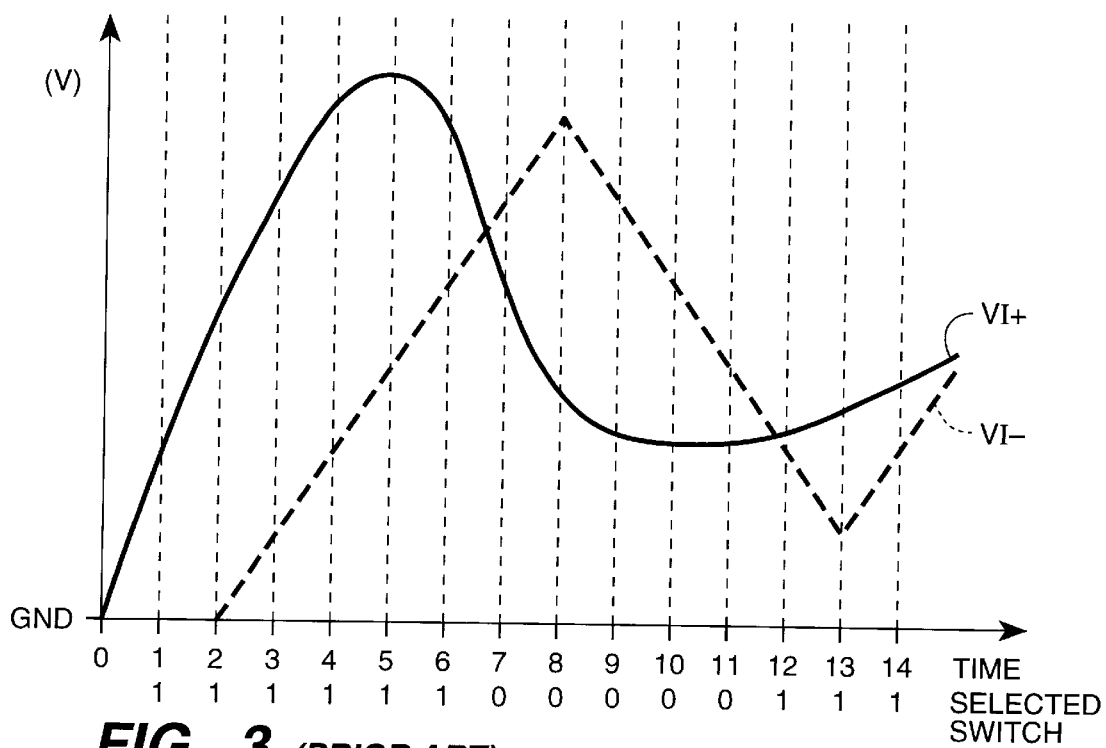
FIG._3 *(PRIOR ART)*
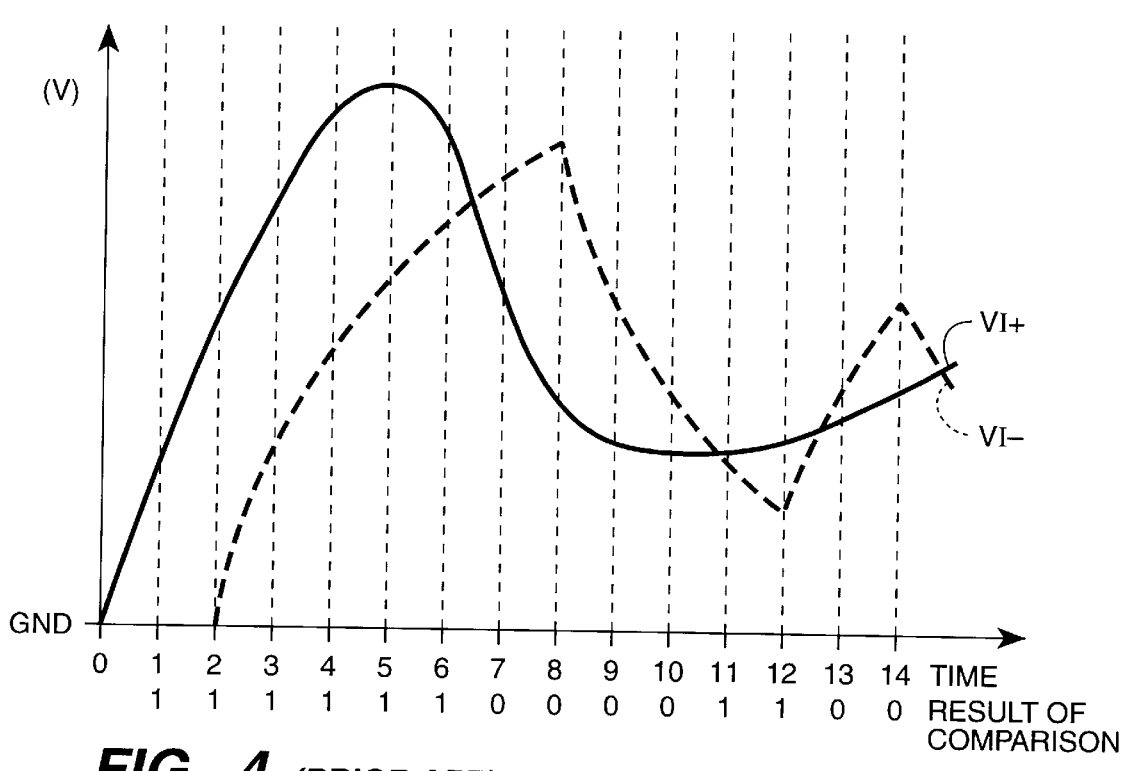
FIG._4 *(PRIOR ART)*

DATA CONVERTERS FOR SOUND EQUIPMENT

BACKGROUND OF THE INVENTION

This invention relates to data converters, say, for a sound equipment, and, more particularly, to the circuit structure of such data converters carrying out data conversions of the delta modulation type.

For processing an input signal such as a sound signal to provide reverberations to the sound or storing inputted signals as in the echo processing and key control processing for a "karaoke" apparatus or the surround processing for an audio equipment, it has been known to first convert the input signal into a digital signal because only real-time processing can be effected on an analog signal. Signal processing and memory processing are then effected on this converted digital signal and the processed digital signal is converted back to an analog signal to be outputted, say, as a sound signal through a speaker.

A common method of converting an analog signal such as a sound signal into a digital signal has been to use an analog-to-digital (A/D) converter adapted to sample an inputted signal at a specified timing and to record the sampled voltages digitally with a plurality of bits. Thus, a one-to-one correspondence is established between the voltage values of the inputted signal and the voltage values expressed by digital values with a plurality of bits. Other methods include the use of a signal converter adapted to carry out delta modulation (referred to as a DM type signal converter) by comparing an inputted signal with a reference voltage that changes according to the results of earlier comparisons made therebetween such that the inputted signal can be approximated by continuously changing digital voltage values. Also known are signal converters of the so-called adaptive delta modulation type (referred to as ADM type signal converters), which are DM type signal converters with improved approximation characteristics.

A/D converters are convenient in digital signal processing because the voltage value at the time of sampling can be obtained directly as a digital value with a plurality of bits, but the chip size of the semiconductor device which may incorporate it becomes large and its unit price is detrimentally affected because a ladder resistor and a plurality of comparators are required. DM type and ADM type signal converters, on the other hand, cannot easily carry out the kind of data conversion effected by an A/D converter, but they do not adversely affect the unit prices of the semiconductor devices that incorporate them because the chip size can be made significantly smaller than if an A/D converter is used. For this reason, DM type and ADM type signal converters are frequently used for the digital signal processing in inexpensive sound equipments.

Basic principles of DM type and ADM type signal converters are explained next with reference respectively to FIGS. 3 and 4 wherein the horizontal axes represent the time and the vertical axes represent the voltage level. The relative magnitude of the voltage of an inputted signal (VI+) shown by a solid line and a reference voltage (VI−) shown by a broken line is considered at a specified timing. As shown both in FIGS. 3 and 4, if the voltage of the inputted signal is larger than the reference voltage, the result of comparison at that time is indicated by "1", and if the former is smaller than the latter, it is indicated by "0". If the same "result of comparison" repeats twice or more, the direction of direct current which controls the reference voltage is changed, or charging and discharging for the control are switched such that the reference voltage will keep approaching (and thereby better approximating) the voltage of the inputted signal. In this manner, a continuously varying series of digital values is obtained as approximating the inputted signal. A comparison between FIGS. 3 and 4 shows that ADM type signal converters can follow an inputted signal better. This is why ADM type signal converters are frequently used for digital signal processing in acoustical devices.

Since prior art ADM type signal converters use a CR integrator circuit for setting a time constant for charging and discharging, the time constant is small immediately after the beginning of charging or discharging but becomes larger as time goes on. In other words, it is difficult to set the time constant for charging and discharging according to the waveform of a given inputted signal. If a plurality of CR integrator circuits are provided such that the time constant can be changed, the layout area for capacitor used in the integrator circuits becomes too large for integration in a semiconductor device. On the other hand, the ability to approximate an input signal must also be improved.

SUMMARY OF THE INVENTION

It is therefore an object of this invention to provide an inexpensive data converter of an adaptive delta modulation type with a simple structure but having improved characteristics.

A data converter embodying this invention, with which the above and other objects can be accomplished, is a delta modulation type data converter adapted to carry out signal processing by sequentially comparing in cycles an inputted signal with a reference voltage set according to the results of previous comparisons and may be characterized as comprising a plurality of current sources, switch circuits for setting a current value by appropriately selecting one or more of these current sources, an integrator circuit for generating a reference voltage according to the current value thus set, and a control circuit for controlling the switch circuits to make an appropriate selection of these current sources according to the result of comparison between the reference voltage and the inputted analog signal. The control circuit controls the switch circuits such that, if the result of comparison is the same as in the previous cycle, a selection from the current sources is made such that the current value will be increased, provided such selection is possible. If the result of comparison is inverted from the previous cycle, a selection is made such that the current direction with respect to the integrator circuit is reversed. If the result of comparison is inverted repeatedly for a specified plural number of cycles, a selection is made such that the current direction with respect to integrator circuit is reversed and the associated current value is reduced, provided such selection is possible. The plurality of current sources may include a first group connected to a source voltage and a second group connected to the ground (serving as the reference voltage source), the current sources in each group having associated therewith current values which differ by a factor of 2 from one to another.

Data converters according to this invention are capable of bringing a reference voltage close to the voltage value of an inputted signal by means of a simple circuit structure such that semiconductors incorporating them can be produced at a reduced cost. The approximation can be accomplished more quickly and more efficiently such that a sound signal with higher fidelity to the inputted signal can be outputted.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a block diagram of a data converter embodying this invention;

FIG. 2 is a graph showing the principle of operation of the data converter of FIG. 1 according to this invention;

FIG. 3 is a graph showing the principle of a prior art delta modulation type data converter; and FIG. 4 is a graph showing the principle of a prior art adaptive delta modulation type data converter.

DETAILED DESCRIPTION OF THE INVENTION

The invention is described next with reference to FIGS. 1 and 2. In what follows, adaptive delta modulation type data converters are simply referred to as data converters.

A data converter embodying the invention, as shown in FIG. 1, comprises an input terminal VI, a first (distortion removing) filter circuit 1, a comparator 2, first and second digital-to-analog (D/A) converter circuits 3 and 3a, a signal processing circuit 4, a second (waveform smoothing) filter circuit 5 and an output terminal VO. The input terminal VI is for receiving a signal to be converted such as a voice (or sound) signal from an input device such as a microphone or a magnetic reader and is connected to the non-inversion input terminal of the comparator 2 through the first filter circuit 1 for which may be used a low pass filter (LPF) adapted to pass only frequencies less than one-half of the sampling frequency. The comparator 2 is for comparing a currently inputted signal (VI+) with a reference voltage (VI−) set according to the result of earlier comparison to thereby output a series of continuously varying digital values. The output terminal of the comparator 2 is connected both to the first D/A converter circuit 3 for generating a voltage, which depends on the result of the comparison, and to the signal processing circuit 4 which may be a one-chip microcomputer for carrying out signal processing by using the digital signal outputted from the comparator 2. The output of the first D/A converter circuit 3 is connected to the inversion input terminal of the comparator 2. The output of the signal processing circuit 4 is connected to the output terminal VO through the second D/A converter circuit 3a for converting the processed digital signal and the second filter circuit 5 for making a smooth waveform from the analog voltage outputted from the second D/A converter circuit 3a. The output terminal VO is adapted to be connected to an output device such as a speaker through which the regenerated analog voltage is outputted.

The first and second D/A converter circuits 3 and 3a are structured similarly, and hence only the structure of the former is illustrated in FIG. 1. Each of the D/A converter circuits 3 and 3a comprises a plurality of constant current sources A1–A8 each set to a specified current value, switch circuits S1–S9 for selectively connecting these constant current sources A1–A8 so as to be able to provide various current values which increase in a step-wise manner, an integrator circuit 32 having a capacitor 34 and a resistor 35 for generating a reference voltage corresponding to the current value selected by the switch circuits S1–S9, and a control circuit 31 for controlling the selection by the switch circuits S1–S9 according to the results of successive comparisons. The current values associated with the individual constant current sources A1–A8 might be selected such that step-wise increments in the reference voltage can be obtained according to the waveform of the inputted signal to be converted. In the example shown in FIG. 1, the current value I associated with the first current source A1 is used as the unit value, the current values of the second through fourth current sources A2–A4 being 2I, 4I and 8I, respectively. Those of the fifth through eighth current sources A5–A8 are -I, -2I, -4I and -8I, respectively, the negative signs indicating that currents are adapted to flow in opposite directions with respect to the integrator circuit 32. These constant current sources A1–A8 can be formed by changing ratios of areas of transistors connected as current mirrors.

The D/A converter circuits 3 and 3a each include two parallel combinations of a plurality of current circuits each including a constant current source and a switch circuit connected in series, one of them connected to a voltage source Vcc and the other connected to a reference voltage, or ground voltage (GND). Selected ones of these current sources are connected to the inversion input terminal of the comparator 33, of which the non-inversion input terminal is kept at the reference voltage. The integrator circuit 32 is formed with the capacitor 34 and the resistor 35 connected in parallel, and its output is connected to the non-inversion input terminal of the comparator 2.

FIG. 2 is referenced next to explain by way of an example how the data converter shown in FIG. 1 functions. Explained briefly first as an outline, a reference voltage (VI−) shown by the bar graph is "prepared" in response to an input signal (VI+) to be converted, that is, by being compared to the input signal (VI+). As before, results of comparison between the input signal and the prepared reference signal will be indicated by "1" if the reference voltage is lower than the inputted signal and by "0" if they are the other way around. FIG. 2 also shows which of the constant current sources are selected and the switch circuits corresponding to them are switch on for setting the next reference voltage according to the result of previous comparison. Voltage differentials (Δ1–Δ4) for the reference voltage are determined according to the selected current values. Constant current sources A1–A4 serve to increase the reference voltage, and constant current sources A5–A8 serve to reduce the reference voltage.

For the sake of explanation, let us assume, as shown in FIG. 2, that a signal is inputted at time t0 and increases rapidly, undergoing slower changes thereafter. For a reason not essential to this invention, the control circuit 31 is so programmed that, as soon as the converter incorporating it as shown in FIG. 1 is switched on, whether any signal is then being received or not from an external source, preselected one or ones of the switch circuits S1–S9 will be switched on such that a pre-selected reference voltage will be outputted. Let us assume in this example that the control circuit 31 is so programmed that the switch circuit S1 will be switched on to active the constant current source A1 when an external voltage is inputted.

For simplifying the explanation with reference to FIG. 2, it is assumed that the converter was switched on at t0, or slightly prior thereto. Thus, the reference voltage begins to rise at time t0 such that it will reach the level of Δ1 at t1. Between times t1 and t4, the inputted signal is increases rapidly, as shown in FIG. 2, and since the inputted signal remains higher than the reference voltage for the first few cycles, the reference voltage must be increased as quickly as possible such that it comes closer to the inputted signal, or that the so-called quantization error is minimized. For this purpose, the control circuit 31 outputs control signals to the switch circuits S1–S4 such that the current value will sequentially increase after each comparison, increasing the voltage differential each time so that the reference voltage will catch up with the inputted signal as quickly as possible.

The comparison at time t4 shows that the reference voltage has reached and become higher than the inputted signal. In other words, the output voltage from the comparator 2 is inverted and the result of comparison is "0" at time t4. The control circuit 31 responds to this change in the comparator output by selecting a current of the same magnitude as that which was previously selected (A4) but flowing in the opposite direction (or the source A8) by activating the corresponding switch circuit S8 (and also by changing the signal to switch circuit S9), thereby causing the reference voltage to decrease. Since the result of comparison changes again (from "0" to "1") between times t4 and t5, the current source A8 is selected again at time t5 for the same reason.

Even alone by repeating the procedure as described above, it is possible to obtain a continuously varying digital signal corresponding to an inputted signal. If the inputted signal varies only gradually or becomes constant after a certain time, however, the reference voltage may keep oscillating, as shown in FIG. 2 at times t4 and t6. In order to prevent situations like this, the control circuit 31 according to this invention is programmed such that, when the comparison result is inverted from the same constant current source twice in a row, as at times t7, t11 and t14 in the example of FIG. 2, it is concluded that the voltage of the inputted signal is somewhere in the middle and, if there is available a constant current source with one half of the current value selected previously and flowing in the opposite direction with respect to the integrator circuit 32, the switch circuit is controlled such that such constant current source will be selected.

This is illustrated in FIG. 2, for example, at time t7. At time t5, the current direction was inverted with the same voltage differential Δ4. At the next sampling time t6, the current direction was again inverted with the same voltage differential. Thus, the choice was to invert the current direction and to halve the voltage differential to Δ3 from Δ4. At time t14, similarly, the current direction was inverted and the voltage differential was halved again from Δ3 to Δ2.

By repeating the procedure as described above, it is possible to obtain a digital signal more closely resembling the inputted analog voltage waveform.

The digital signal thus obtained and outputted from the comparator 2 is subjected to a waveform correcting process by the signal processing circuit 4 which may comprise a one-chip microcomputer or a DSP. Thereafter, the digital signal thus processed is introduced into the second D/A converter circuit 3a, which functions similarly to the first D/A converter circuit 3 and generates an analog signal. The signal thus generated is passed through the low pass filter circuit 5 and a smoothed analog signal is outputted from the output terminal VO to an output device such as a speaker.

The invention has been described above with reference to only one example, but this example is not intended to limit the scope of the invention. Many modifications and variations are possible within the scope of this invention. For example, although FIG. 1 shows an example wherein the constant current values can be varied in four stages, the number of stages can be varied as required. The number of consecutive inversions in the current direction before the voltage differential is halved need not be two, but may be set otherwise, depending on the waveform of the inputted signal. Although FIG. 1 shows an example wherein the current values of the constant current sources increase by a factor of 2, the area ratios of transistors forming current mirrors serving as the constant current sources can be easily modified. It is also feasible to provide a plurality of constant current sources with the same current value and to add the currents from these sources. The data converter according to this invention can be formed by using bipolar elements or MOS elements. The switch circuit S9 shown in FIG. 1 may be omitted. The integrator circuit need not have the same circuit structure as shown in FIG. 1. Any circuit structure capable of converting a current into voltage can acceptable. In summary, all such modifications and variations that may be apparent to a person skilled in the art are intended to be included within the scope of this invention. The present invention provides data converters which are capable of bringing the voltage value of a reference voltage close to that of an inputted signal by means of a simple circuit structure such that semiconductor devices can be produced at a reduced cost. The approximation can be accomplished more quickly and more efficiently such that a sound signal with higher fidelity to the inputted sound signal can be outputted.

What is claimed is:

1. A delta modulation type data converter adapted to compare an inputted analog signal with a reference voltage in cycles and to output a continuously varying digital signal, said data converter comprising:

a plurality of current sources;

switch circuits for setting a current value by appropriately selecting one or more of said current sources;

an integrator circuit for generating said reference voltage according to a specified current value; and a control circuit for controlling said switch circuits to make an appropriate selection of said current sources according to the result of a comparison between said reference voltage and said inputted analog signal, said control circuit controlling said switch circuits such that:

if the result of said comparison is the same as the result of said comparison in the previous cycle, a selection from said current sources is made such that said current value is increased, provided such selection is possible;

if the result of said comparison is inverted from the previous cycle, a selection from said current sources is made such that the current direction with respect to said integrator circuit is reversed; and if the result of said comparison is inverted repeatedly for a specified plural number of cycles, a selection from said current sources is made such that the current direction with respect to said integrator circuit is reversed and the associated current value is reduced, provided such selection is possible.

2. The data converter of claim 1 wherein said plurality of current sources include a first group connected to a source voltage and a second group connected to a reference voltage source, the current sources in each of said first and second groups having associated therewith current values which differ by a factor of 2 from one to another.

3. The data converter of claim 1 further comprising:

an input terminal for receiving said analog signal; and a comparator connected to receive said analog signal from said input terminal and said reference signal from said integrator circuit and adapted to output a digital comparison signal according to the result of comparison between said analog signal and said reference signal received thereby both to said control circuit and through a digital-to-analog converter circuit to an output terminal from which an analog output signal is outputted.

4. The data converter of claim 2 further comprising:

an input terminal for receiving said analog signal; and a comparator connected to receive said analog signal from said input terminal and said reference signal from said integrator circuit and adapted to output a digital comparison signal according to the result of comparison between said analog signal and said reference signal received thereby both to said control circuit and through a digital-to-analog converter circuit to an output terminal from which an analog output signal is outputted.

* * * * *